United States Patent [19]

Imahashi et al.

[11] Patent Number: 5,173,641
[45] Date of Patent: Dec. 22, 1992

[54] PLASMA GENERATING APPARATUS

[75] Inventors: Issei Imahashi; Nobuo Ishii, both of Yamanashi, Japan

[73] Assignee: Tokyo Electron Limited, Tokyo, Japan

[21] Appl. No.: 757,953

[22] Filed: Sep. 12, 1991

[30] Foreign Application Priority Data

| Sep. 14, 1990 | [JP] | Japan | 2-244248 |
| Jun. 10, 1991 | [JP] | Japan | 3-163424 |
| Jun. 10, 1991 | [JP] | Japan | 3-163425 |

[51] Int. Cl.$^5$ ............................................. H05H 1/18
[52] U.S. Cl. ........................ 315/111.41; 315/111.21; 313/231.31; 204/298.16; 204/298.37; 204/298.38
[58] Field of Search ...................... 315/111.21, 111.41, 315/111.51, 111.81; 313/231.31; 205/298.38, 298.37, 298.16

[56] References Cited

U.S. PATENT DOCUMENTS

| 4,987,346 | 1/1991 | Katzschner et al. | 315/111.41 |
| 4,990,229 | 2/1991 | Campbell et al. | 315/111.41 X |
| 5,022,977 | 8/1991 | Matsuoka et al. | 315/111.41 X |
| 5,032,202 | 7/1991 | Tsai et al. | 315/111.41 X |
| 5,053,678 | 10/1991 | Koike et al. | 315/111.41 X |

FOREIGN PATENT DOCUMENTS 58-13626 3/1983 Japan.
59-202635 11/1984 Japan.

Primary Examiner—Eugene R. LaRoche
Assistant Examiner—D. Hyum Yoo
Attorney, Agent, or Firm—Oblon, Spivak, McClelland, Maier & Neustadt

[57] ABSTRACT

A plasma generating appartus according to the present invention generates a plasma by cyclotron movement of electrons. The apparatus features microwave introducing guides for introducing microwaves, a reaction chamber in which a plasma is generated based on introduced microwaves, a magnetic field generating section, and solenoid coils. The magnetic field generating section features at least a pair of magnetic poles having mutually facing concave surfaces, and a yoke for coupling the magnetic poles to constitute a loop of magnetic force lines. The magnetic poles are arranged to face each other with the microwave introducing guides and the reaction chamber interposed, and the magnetic poles generate a magnetic field of a predetermined magnetic flux density consisting of magnetic force lines directed vertically to a major surface of a sample placed on a support table in the reaction chamber. The solenoid coils can vary the magnetic field of a predetermined magnetic flux density generated by the magnetic field generating section to a magnetic field of a desired magnetic flux density.

15 Claims, 7 Drawing Sheets

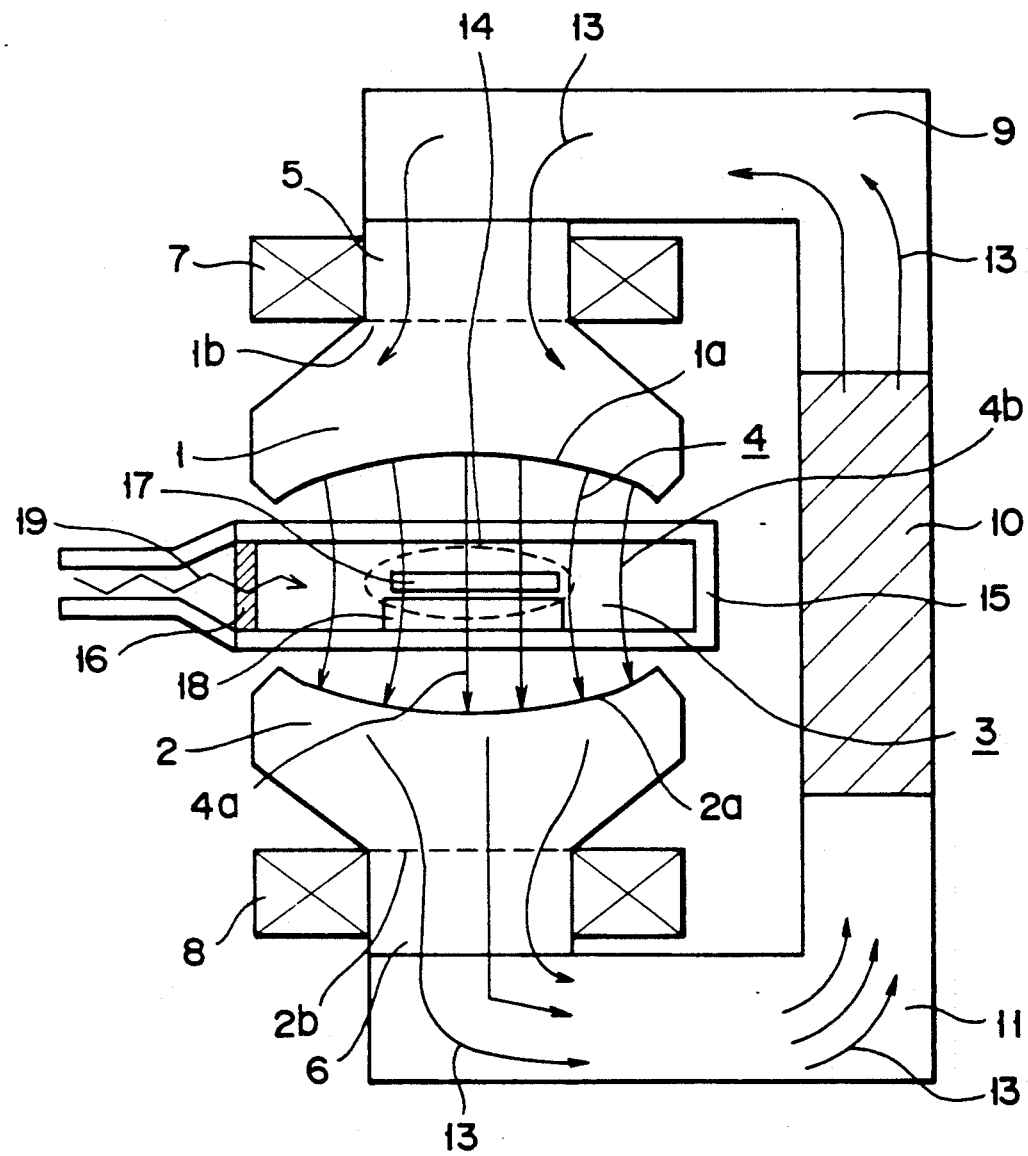
F I G. 1

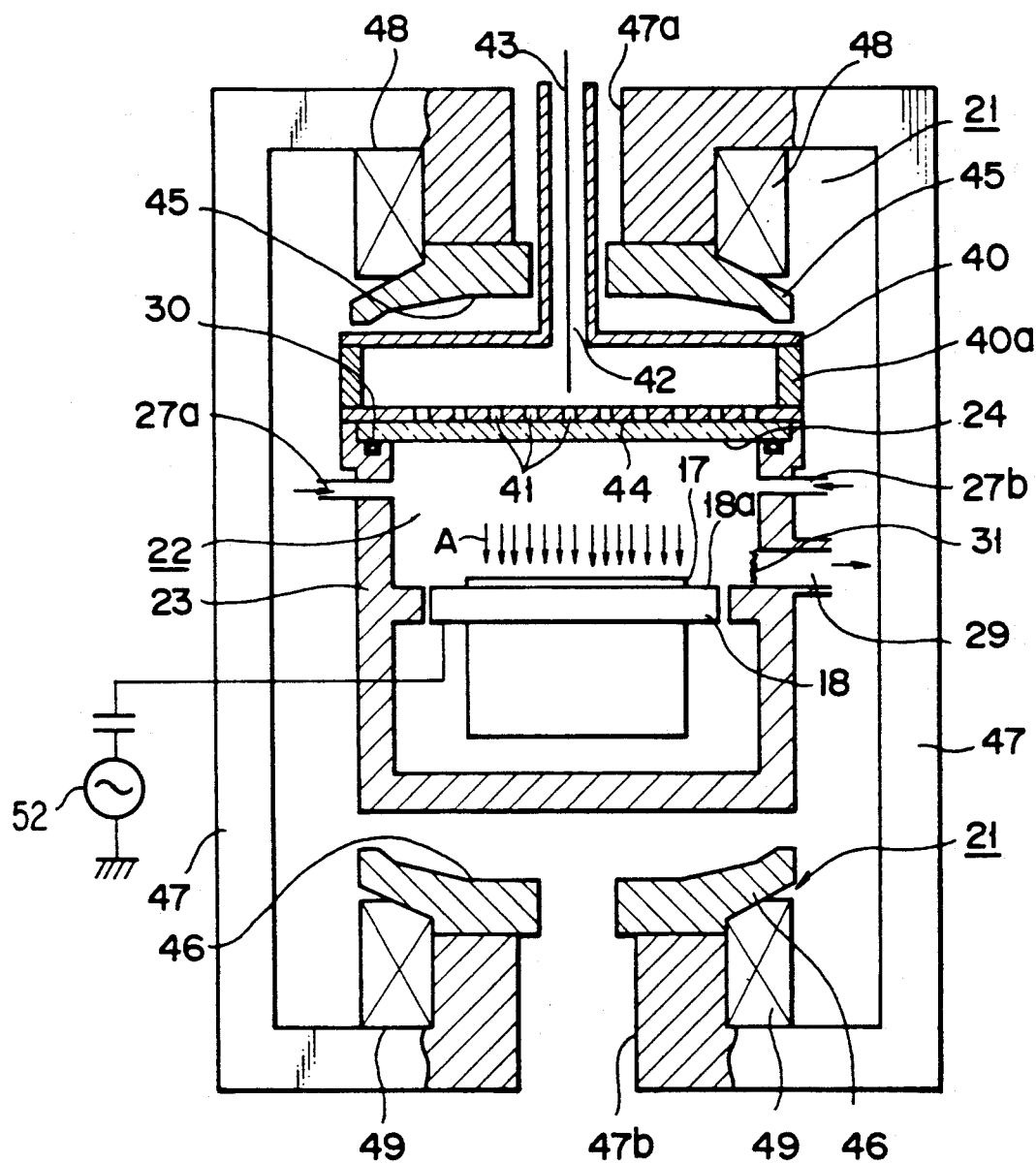
F I G. 6

PLASMA GENERATING APPARATUS

BACKGROUND OF THE INVENTION

1. Field of the Invention

The present invention relates generally to a plasma generating apparatus and more particularly to a plasma generating apparatus wherein a plasma is generated by microwaves and a magnetic field to etch a sample such as a semiconductor wafer or to form a film on the sample.

2. Description of the Related Art

In general, in accordance with the higher integration density of an integrated circuit formed on a semiconductor substrate, etc., it is necessary to reduce the size of circuit elements constituting the integrated circuit and the thickness of wires for connecting these circuit elements, with high reliability.

In an example of the apparatus for manufacturing the integrated circuit, there is employed a plasma generating apparatus wherein a magnetic field is applied in a low-vacuum atmosphere into which a process gas is introduced, and microwaves are applied to the magnetic field to accelerate electrons in a cyclotron, thus generating a plasma. A typical example of this apparatus is an ECR (Electron Cyclotron Resonance) apparatus.

The ECR apparatus is generally divided into a plasma generating chamber and a reaction chamber. A plasma generated in the plasma generating chamber is taken out of the chamber in the form of a beam and is radiated to a sample placed in the reaction chamber directly or via a target. Thus, the sample is etched, or a film is formed on the sample. A coil for generating the magnetic field in the plasma generating chamber is parallel to a major surface of a semiconductor wafer of the sample, and the coil is wound around the plasma generating chamber in a ring-shape.

The plasma generated by the plasma generating apparatus employed in the ECR apparatus has a high density. In addition, since ions travel straight along a magnetic field in a direction in which a magnetic field is attenuated, the plasma has a relatively anisotropic property and a low temperature.

Accordingly, when the ECR apparatus is employed as an etching apparatus, a straight anisotropic beam plasma is radiated onto a major surface of the wafer to carry out fine processing; on the other hand, if the ECR apparatus is employed as a thin-film forming apparatus, burying of contact holes can be effectively performed by virtue of anisotropy in the direction of formation of thin-film.

However, the above ECR apparatus has a two-chamber structure, and the size thereof is large. In order to effectively take out ions from the plasma in the electric field and radiate the ions on the wafer, a high voltage (several hundred voltage) must be applied. In this case, there is problem that the ion energy increases due to the application of high voltage. The consumption of power can be reduced and ion energy is reduced, for example, by placing the sample in the plasma; however, with this structure, the sample absorbs microwaves as heat or high-energy electrons collide with the sample, and therefore the temperature thereof increases. Consequently, the quality and characteristic of the formed film are damaged, and the quality of the film is degraded.

As is well known, when an electric current is supplied to a coil for generating a magnetic field, a magnetic field is formed such that the lines of magnetic force extend from the inside of the coil, run along the outer periphery of the coil, and return to the inside of the coil.

When the sample is situated such that the lines of magnetic force emitted from the inside of the coil are made incident perpendicularly onto the major surface of the wafer, the lines enter the center part of the major surface perpendicularly but do not enter the outer peripheral part of the major surface. Specifically, the lines are inclined from the center of the sample towards the outer periphery thereof.

When the above ECR apparatus is employed for etching, the plasma enters in the direction of the lines of magnetic force, and the lines do not perpendicularly enter the entire surface of the sample. Thus, vertical etching cannot be performed. As a result, fine processing cannot be carried out, owing to side etching effected on the outer peripheral part of the sample and a difference in etching rate (the center part is etched at a higher rate than the outer peripheral part).

In particular, in accordance with the increase in area of the sample, the influence due to the above problems increases.

More specifically, as the area of the semiconductor wafer of the sample increases, the size of the coil increases accordingly and a large electric power for generating a necessary magnetic field is required. For example, when microwaves of 2450 MHz are employed, the magnetic field of 875 gauss is required in the ECR region. When the diameter of the wafer is 10 inches, the size of the magnetic field generating coil increases such that, for example, the inside diameter is 500 mm, the outside diameter is 660 mm and the height is 80 mm. In this case, in order to generate an intense magnetic field of 875 gauss in the entire ECR region, an electric current of 40,000 ampere's turn or more must be supplied to the magnetic field generating. The electric power to be required is 16 KWh or more. In addition, when the diameter of the wafer is 12 inches or more, the size of the apparatus increases and a large power is required.

SUMMARY OF THE INVENTION

The object of the present invention is to provide a plasma generating apparatus having a smaller size while power consumption is reduced. The apparatus is capable of easily carrying out fine processing and highly efficient plasma treatment, while preventing a sample from being heated by microwaves.

A plasma generating apparatus according to this invention comprises: microwave introducing means for introducing microwaves; plasma generating means for generating a plasma based on microwaves introduced into the microwave introducing means, and storing a sample so that the sample can be freely removed; at least a pair of magnetic field generating means each having a magnetic pole, said magnetic field generating means being arranged to face each other with the plasma generating means interposed and generating a magnetic field of a predetermined magnetic flux density consisting of lines of magnetic force which vertically enter a major surface of the sample; coupling means for coupling the paired magnetic poles of the magnetic field generating means, and forming a loop of lines of magnetic force; and magnetic field generation correcting means for varying a magnetic field of a predetermined magnetic flux density generated by the magnetic field generating means to a magnetic field of a desired magnetic flux density.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention, FIG. 1 illustrates the concept of a plasma generating apparatus according to the present invention;

FIG. 6 shows a structure of a plasma generating apparatus according to a third embodiment of the invention wherein this apparatus has been applied to an etching apparatus;

DETAILED DESCRIPTION OF THE PREFERRED EMBODIMENTS

Figure 2:
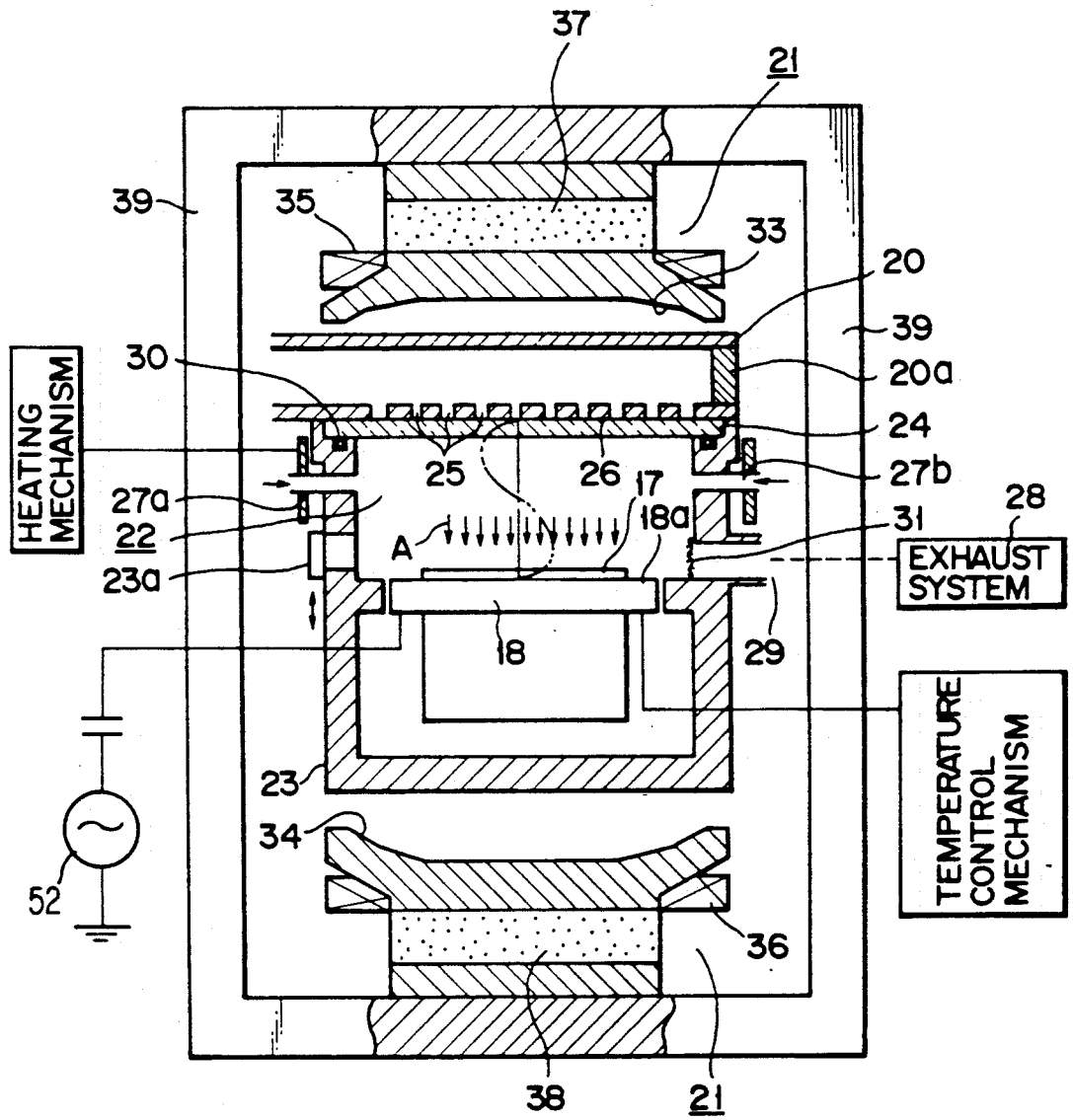
FIG. 2 shows a structure of a first embodiment of the invention, wherein the plasma generating apparatus of this invention has been actually applied.

Embodiments of the present invention will now be described with reference to the accompanying drawings.

FIG. 1 is a view for illustrating the concept of a plasma generating apparatus according to the present invention.

In the plasma generating apparatus, a magnetic pole piece 1 and a magnetic lower pole piece 2 (both formed of, e.g. soft iron) are arranged to face each other. A plasma space 3 where a plasma is generated is provided between the pole pieces 1 and 2.

The pole pieces 1 and 2 have mutually facing concave surfaces (upper opposite surface 1a and lower opposite surface 2a).

By virtue of the shapes of the surfaces 1a and 2a, a magnetic flux 4a generated from the center part of the upper opposite surface 1a travels towards the center part of the lower opposite surface 2a. Magnetic fluxes 4b generated from the peripheral part of the upper opposite surface 1a travel towards the peripheral part of the lower opposite surface 2a substantially linearly.

Rear surfaces 1b and 2b of the pole pieces 1 and 2, which are opposed to the facing opposite surfaces 1a and 2a, are connected to and integrated with magnetic bodies 5 and 6 (formed of, e.g. soft iron). Each of the magnetic bodies 5 and 6 has a smaller diameter than the corresponding opposite surface 1a, 2a.

Solenoid coils 7 and 8 capable of controlling (e.g. varying) the intensity of the magnetic field in the plasma space 3 are provided around the magnetic bodies 5 and 6.

The magnetic body 5 is connected to one end of a permanent magnet 10 for generating a magnetic field via a highly magnetic yoke 9, and the magnetic body 6 is connected to the other end of the magnet 10 via a similar yoke 11. The conductors 5 and 6, yokes 9 and 11 and magnet 10 constitute a C-shaped structure. The C-shaped structure functions as a magnetic field forming section, and a closed loop of magnetic fluxes is formed via the plasma space 3 (magnetic fluxes 4).

The solenoid coils 7 and 8 serving as magnetic field forming auxiliary parts are employed to control the intensity of the magnetic field generated by the permanent magnet 10, etc. thereby setting the density of magnetic flux in the generation area 14 of the ECR to 875 gauss. Hereinafter, the combination of the magnetic field forming section and the magnetic field forming auxiliary parts is referred to as "magnetic field forming section."

In order to set the density of magnetic flux of the generation area 14 of the ECR to 875 gauss in the manufacture of the apparatus, the density of magnetic flux is corrected by the solenoid coils 7 and 8 very slightly. For example, a power consumption is only about 0.2 KWh or less.

Suppose that the distance between the ferromagnetic pole pieces 1 and 2 is 20 cm, the diameter of each pole piece is 30 cm, the inside diameter of each solenoid coil 7, 8 is 17 cm, the outside diameter of each solenoid coil is 25 cm, the height of each solenoid coil is 4 cm, and the two solenoid coils 7 and 8 are arranged vertically. In this case, the electric current needed to obtain the density of magnetic flux of 875 gauss is about 14,000 ampere's turn even if no permanent magnet is used. The volume of each solenoid coil is much smaller than that of a conventional one, and the electric power consumed by the solenoid coils is only 1.6 KWh.

In the present invention, the permanent magnet and the solenoid coils are combined; however, it is easy to obtain a desired density of magnetic flux of 875 gauss by using only the solenoid coils.

A vacuum chamber 15 for treating wafers is situated within the plasma space 3, and an introducing port 16 for introducing microwaves of 2450 MHz is provided on one side of the vacuum chamber 15. In FIG. 1, the port 16 is provided in the side wall of the chamber 15 for the purpose of convenience; actually, the port is provided so as to introduce microwaves in a direction vertical to the major surface of a sample, e.g. a semiconductor wafer (hereinafter called "wafer").

A support table 18 for supporting a wafer 17 is provided within the vacuum chamber 15.

In the plasma generating apparatus having the above structure, a vacuum is erected in the vacuum chamber 15 and thereafter a process gas is introduced and microwaves 19 of 2450 MHz are introduced from the introducing port 16. A magnetic field having a density of magnetic flux of 875 gauss is generated in the ECR generation region 14 above the wafer 17. Then, electrons in the ECR generation region and near the ECR generation region resonate and start to rotate. The electrons collide with the process gas and are ionized. Thus, a plasma is generated to treat the sample.

The concave shapes of the facing surfaces of the pole pieces 1 and 2 are determined by computer simulation in order to obtain a uniform density of magnetic flux.

FIG. 2 shows a structure of a first embodiment in which the plasma generating apparatus of this invention has been applied. In the second and subsequent embodiments of the invention, common structural elements are denoted by like reference numerals.

The main part of the first embodiment is constituted by a rectangular waveguide 20 serving as a microwave introducing section, a magnetic field forming section 21, and a reaction chamber 22 in which a support table 18 for supporting a sample or a semiconductor wafer 17 is provided.

The reaction chamber 22 has a cavity resonator structure for exciting electron cyclotron resonator structure. The electronic cyclotron resonator structure comprises a container or apparatus body 23 of a non-magnetic material such as aluminum alloy or stainless steel, the rectangular waveguide 20 mounted on an upper opening of the body 23 via a microwave-permeable quartz glass 24, and an electrically conductive support table 18 having a mount surface 18a on which wafer 17 is mounted. The support table 18 is opposed to an upper opening plane 26 with microwave discharge ports 25 of the rectangular waveguide 20.

In the above structure, suppose that the distance between the upper opening plane 26 and mount surface 18a is $(\lambda g/2) \times n$ (integer) when the wavelength of microwave is $\lambda$ g. In this case, electron cyclotron resonance of TE mode or TEM mode can be effected in the reaction chamber 22.

Accordingly, since the wafer 17 is situated on the microwave reflection surface, heating by microwaves can be prevented.

Figure 3:
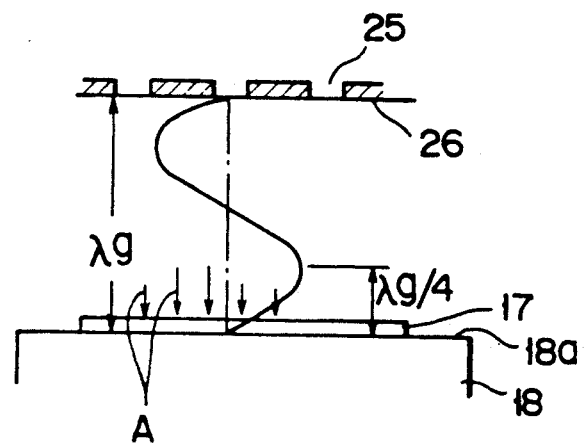
FIG. 3 shows a structure of a wafer placed on a support, at which the plasma has a highest intensity, and microwave introducing ports.

As is shown in FIG. 3, microwave and electrons (electron behavior) resonate at a maximum level in a region located $\lambda$ g/4 above the mount surface 18a, and a plasma with the highest intensity is generated there.

The reaction chamber 22 has supply ports 27a and 27b for supplying a process gas or a reaction gas such as $Cl_2$, $SF_6$ and $CF_4$ into the chamber, and an exhaust port 29 communicating with an exhaust system 28. Thereby, a predetermined vacuum atmosphere is maintained in the reaction chamber 22.

The quartz glass 24 is mounted on the apparatus body 23 with an O-ring interposed in order to maintain a vacuum in the reaction chamber 22. The exhaust port 29 is provided with a filter 31 formed of a non-magnetic, electrically conductive mesh, thereby preventing leakage of microwaves from the apparatus body 23.

The apparatus body 23 is provided with an openable gate 23a for loading/unloading the sample. It is possible to connect the gate 23a to a load-lock chamber, an unload-lock chamber and a convey mechanism and combine the reaction chamber with another process apparatus (chamber), thereby carrying out different processes continuously.

The apparatus body 23 is provided with a heating mechanism for baking the inside wall, in order to attain a predetermined vacuum degree and prevent a product, occurring during the process treatment, from adhering to the inside wall. The support table 18 is provided with a temperature control mechanism for heating/cooling the sample in order to control the temperature of the sample.

Figure 4:
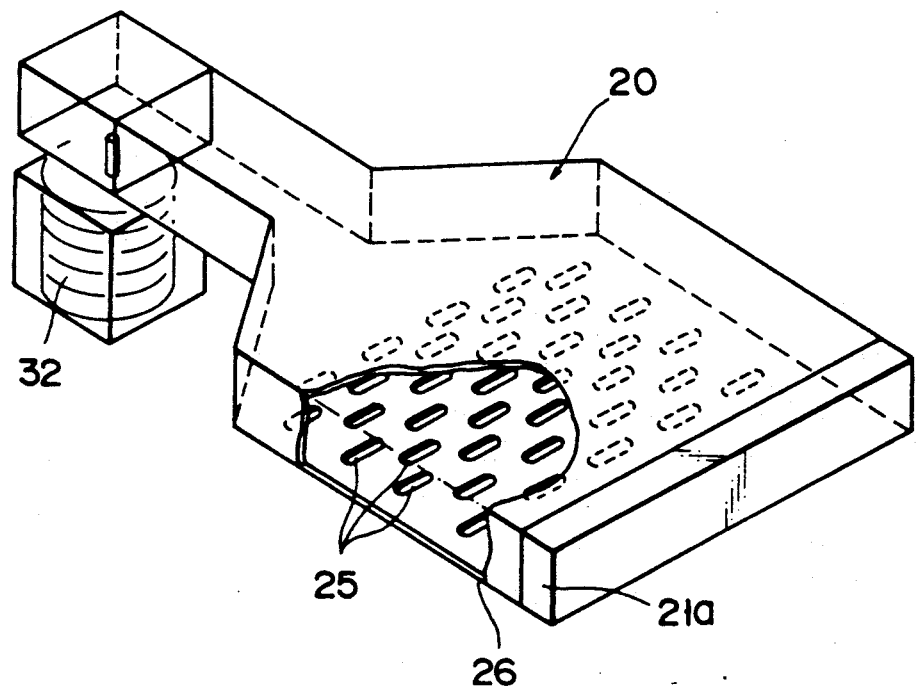
FIG. 4 shows a specific structure of a rectangular waveguide.

FIG. 4 shows a specific structure of the rectangular waveguide 20. The rectangular waveguide 20 has a flat hollow rectangular shape and is connected to a magnetron 32 serving as a microwave supply source. The lower surface of the waveguide 20 is provided with a plurality of slit-like microwave supply ports 25 at predetermined intervals.

An end portion of the waveguide 20 is provided with a microwave absorbing body 21a. The microwave absorbing body 21a absorbs reflected waves generated in the waveguide 20, and the waves are not returned to the magnetron. By cooling the microwave absorbing body 21a from outside, the heating of the waveguide 20 by microwaves can be prevented. Where the wavelength of microwaves is "$\lambda$ t", the microwave supply ports 25 are formed at an interval of 1 cm$\times$($\lambda$ t/2).

Referring back to FIG. 2, the magnetic field forming section 21 comprises upper and lower magnetic poles 33 and 34, magnetic field generating coils 35 and 36, and a yoke 39. The poles 33 and 34 face each other along the vertical axis of the apparatus body 23. The coils 35 and 36 are wound, respectively, around the poles 33 and 34. The yoke 39 is made of a highly magnetic body, e.g. soft iron. The yoke 39 is integrally coupled to the outside surfaces of the magnetic poles 33 and 34 with permanent magnets 37 and 38 interposed.

The magnetic field generating coils 35 and 36 and permanent magnets 37 and 3 of the magnetic field forming section 21 are excited to generate a magnetic field of, e.g. 875 gauss when the frequency of microwaves is 2450 MHz. And vertical lines A of magnetic force are applied to the major surface of the wafer 17 situated in the reaction chamber 22. Microwaves propagated from the magnetron 32 shown in FIG. 4 to the rectangular waveguide 20 are introduced from the microwave supply ports 25 into the reaction chamber 22.

As is shown in FIG. 3, using a process gas fed into the reaction chamber 22, a plasma is efficiently produced in a region located $\lambda$ g/4 above the support table 18 for supporting the wafer 17. Thereafter, ions in the plasma are vertically directed to the major surface of the wafer 17, i.e. in the direction of the lines A of magnetic force. In this case, as shown in FIG. 2, a high-frequency source 52 is connected to the support table 18 to apply a negative potential to the support table 18, thereby extracting ions form the plasma more efficiently.

Figure 5:
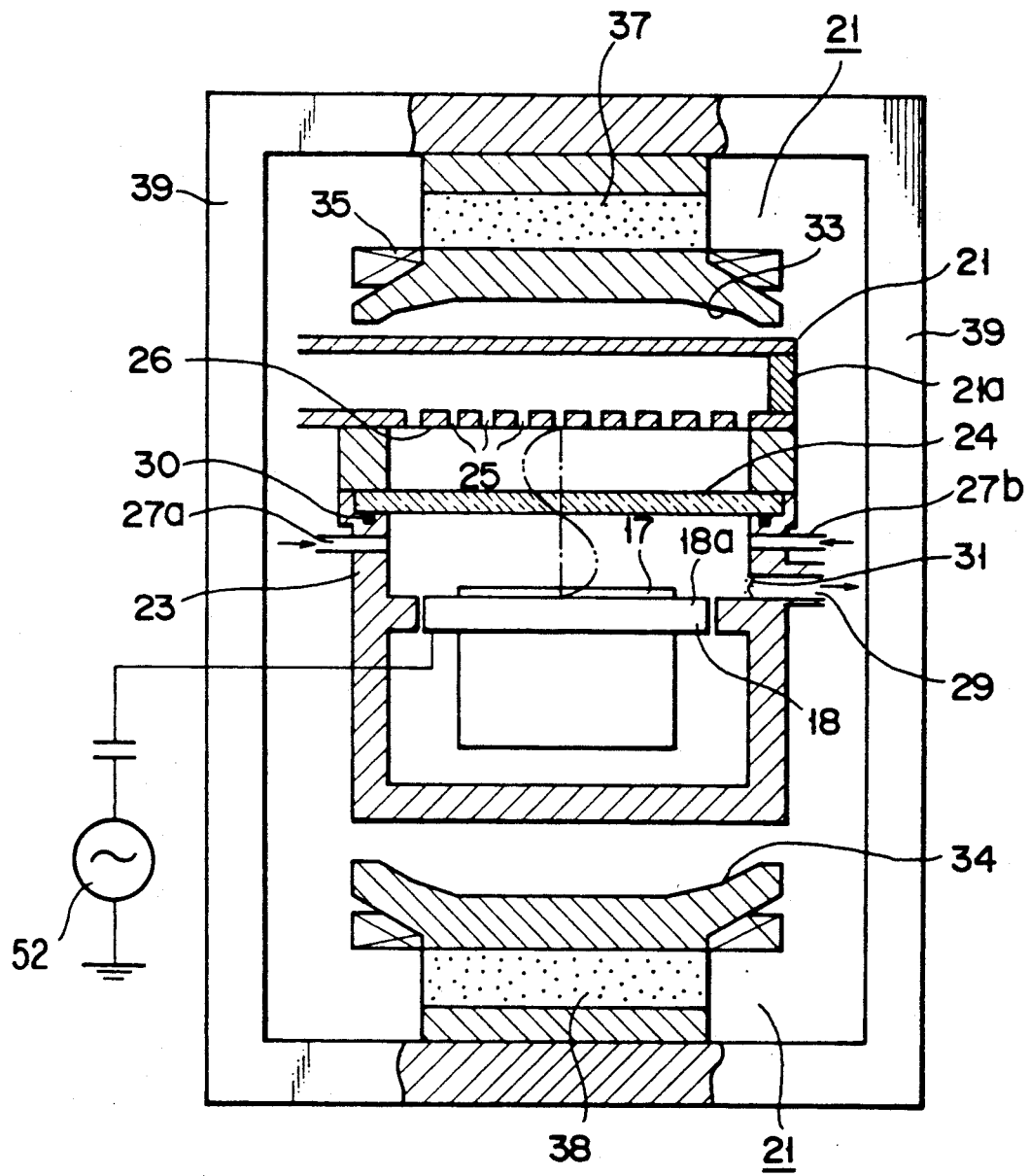
FIG. 5 shows a structure of a plasma generating apparatus according to a second embodiment of the invention.

FIG. 5 shows a structure of a plasma generating apparatus according to a second embodiment of the present invention.

In the above first embodiment, the upper opening plane 26 is put in contact with the quartz plate 24. Thus, two maximum plasma intensity points are present at a region $(\frac{1}{4}) \times \lambda$ g above the supporting plate 18 and a region $(\frac{3}{4}) \times \lambda$ g above the plate 18 where the amplitude of microwave has a maximum value.

Accordingly, in the second embodiment, if the quartz plate 24 is situated $(\frac{1}{2}) \times \lambda$ g above the wafer 17, as shown in FIG. 5, the highest intensity point of process gas exists only at a region located $(\frac{1}{4}) \times \lambda$ g above the supporting table 18. Thus, the plasma is formed in a plane-shape on the wafer 17, and excellent etching is carried out.

Figure 7:
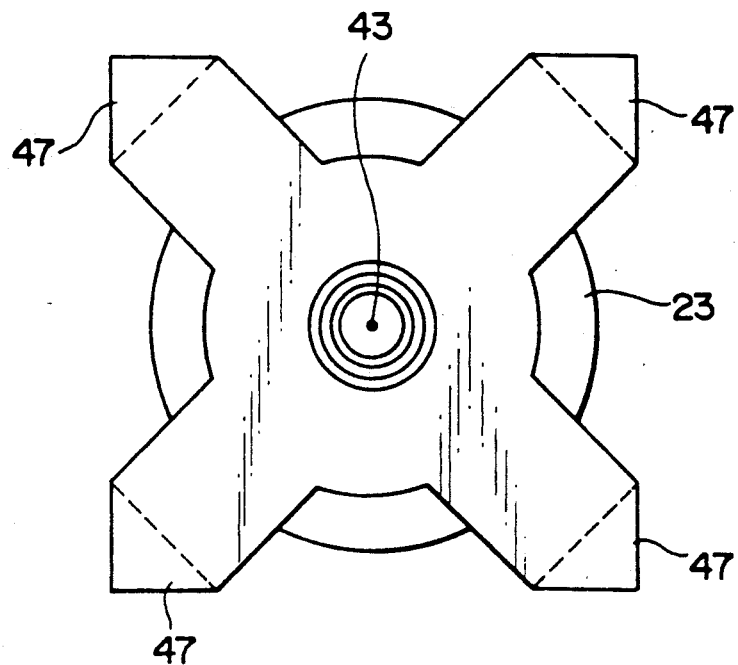
FIG. 7 is a plan view of the etching apparatus shown in FIG. 6.
Figure 8:
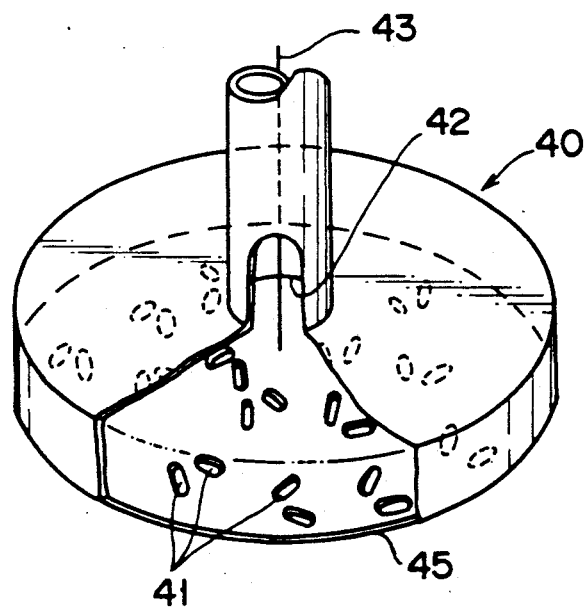
FIG. 8 is a perspective view showing a partial cross section of the microwave introducing port employed in the third embodiment.

FIG. 6 shows a structure of a plasma generating apparatus according to a third embodiment of the present invention, which plasma generating apparatus has been applied to an etching apparatus. FIG. 7 is a plan view of the etching apparatus of FIG. 6, and FIG. 8 is a partial cross-sectional view of the microwave introducing section used in the third embodiment.

In the third embodiment, a radial waveguide 40 is mounted on the upper opening portion of the apparatus body 23 with quartz glass 24 interposed. A plurality of microwave supply ports 41 are radially formed in the radial waveguide 40, as shown in FIG. 8. A coaxial cable 43 connected to a magnetron (not shown) similar to that of FIG. 4 is inserted into an opening 42 provided at the upper central part of the radial waveguide 40.

A microwave absorbing body 40a similar to the absorbing body of the aforementioned rectangular waveguide 20 is mounted around the radial waveguide 40.

The microwave supply ports 41 are formed, for example, at an interval of 1 cm×(λ g/2), when the wavelength of microwave is "λ g".

Specifically, when the wavelength of microwave is "λ t", the distance between a microwave introducing plane 44 and a mount plane 18a of the support table 18 is found as (λ t/2)×n (integer). A TE mode or TEM mode electron cyclotron resonance is caused in the reaction chamber 22.

As is shown in FIG. 7, upper and lower circular magnetic poles 45 and 46 are coupled to a plurality of yokes 47 made of a highly magnetic material such as soft iron. The yokes 47 are formed in four parts symmetrical with respect to the vertical center of the apparatus body 23, thereby constituting a plurality of magnetic circuits. Thus, a magnetic field of uniform, vertical magnetic flux is produced on the major surface of the wafer 17.

Magnetic field generating coils 48 and 49 are wound around the upper and lower magnetic poles 45 and 46 and yokes 47a and 47b coupled to the magnetic poles. Each of the openings of the upper and lower magnetic poles can be utilized as an insertion guide for the coaxial cable 43 of the radial waveguide 40.

According to the plasma generating apparatus of the third embodiment, an ECR plasma is generated by microwaves (e.g. 2.45 GHz) supplied from the magnetron situated outside the apparatus into the radial waveguide 40, and the magnetic field of 875 gauss is produced by the magnetic field generating coils 48 and 49.

The process gas supplied into the reaction chamber 22 is changed to a high-density plasma, and ions in the plasma are radiated vertically to the wafer 17. Thereby, etching of wafer 17 is effected.

An actual example of the plasma apparatus was employed to obtain measurement data. The distance between the upper magnetic pole 45 and the lower magnetic pole 46 was 30 cm, the diameter of each of upper and lower magnetic poles 45 and 46 was 50 cm, the inside diameter of each of magnetic field generating coils 48 and 49 was 44 cm, the outside diameter of each coil was 52 cm, and the height of each coil was 6 cm. It was found that in order to obtain a magnetic flux density of 875 gauss, about 30000 ampere's turn needed to be fed to the magnetic field generating coils 48 and 49. The electric power consumed by the coils 48 and 49 was 7 KWh.

In the third embodiment, the microwave introducing section is composed of the radial waveguide; however, a rectangular waveguide may be used. Any type of microwave introducing section capable of radiating microwaves vertically to the major surface of the sample may be used, and the direction in which microwaves are input to the waveguide and the shape of the waveguide are not limited. In addition, it is possible to use the waveguide in the state in which a dielectric substance is filled.

In the third embodiment, the yoke 47 of the magnetic field generating section is divided into four parts; however, the number of divided parts is not limited only if these parts are symmetrical with respect to the vertical line passing through the center of the reaction chamber 22.

Figure 9:
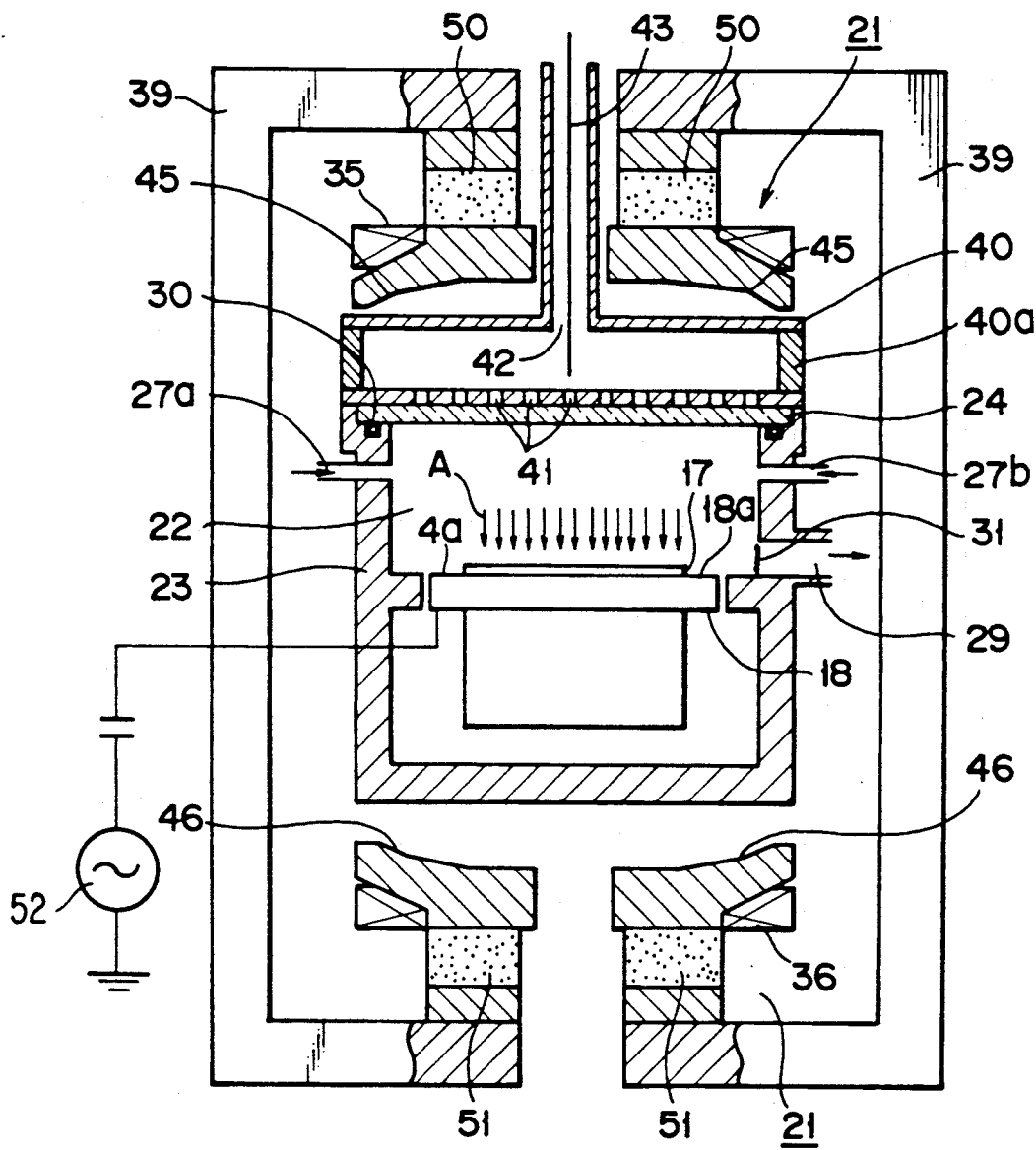
FIG. 9 shows a structure of a plasma generating apparatus according to a fourth embodiment of the invention, wherein this apparatus has been applied to an etching apparatus.

FIG. 9 shows a structure according to a fourth embodiment of the invention, in which the plasma generating apparatus is applied to an etching apparatus.

The fourth embodiment is an improvement of the third embodiment, and the magnetic flux density is increased while the power consumption is reduced.

Each magnetic field generating section 21 comprises upper and lower magnetic poles 45 and 46 facing each other along the vertical axis of the apparatus body 23, magnetic field generating coils 35 and 36 mounted around the magnetic poles 45 and 46, and a yoke 39 coupled to the rear parts of the magnetic poles with permanent magnets 50 and 51 interposed.

In the magnetic field generating section, errors in manufacture of the permanent magnets 50 and 51 and other magnetic circuits can be corrected by controlling the electric current flowing through the magnetic field generating coils 35 and 36.

In the fourth embodiment, 90% of a desired intensity of magnetic field can be obtained only by the permanent magnets 50 and 51. Thus, it is sufficient that the remaining 10% of the intensity is obtained by the magnetic field generating coils 35 and 36, and the consumed power of the coils 35 and 36 can be reduced.

Since the permanent magnets 50 and 51 are provided near the reaction chamber 22, the magnetic field leaking from the magnets 50 and 51 can be reduced, and the adverse effect on the surroundings of the apparatus can be reduced.

A specific example of the plasma generating apparatus according to the fourth embodiment will now be described. In this example, it is supposed that the distance between the mutually facing upper and lower magnetic poles 45 and 46 is 30 cm, the diameter of each magnetic pole is 50 cm, the inside diameter of each of magnetic field generating coils 35 and 36 is 44 cm, the outside diameter of each coil is 52 cm, and the height of each coil is 4 cm. In this case, the electric current, which need be supplied to the coils 35 and 36 in order to obtain the density of magnetic flux of 875 gauss, is about 3,500 ampere's turn. The electric power consumed by the coils 35 and 36 is only 0.7 KWh.

The above embodiments are not limited to etching apparatuses; these embodiments can easily be applied to a film forming apparatuses such as plasma CVD apparatuses.

As has been described above, the following advantages can be obtained by the plasma generating apparatus of the present invention:

(1) Electron cyclotron resonance occurs in the region between the plane at which the microwave supply ports are formed and the plane of the electrically conductive support table on which the sample is placed. Thus, the support table functions as a reflection plate in the cavity in which electron cyclotron resonance is caused. Microwaves are not absorbed in the sample as heat, and the heating of the sample can be prevented.

(2) The position of the maximum intensity of plasma is set at ¼ wavelength of microwave above the support table on which the sample is placed; therefore, plasma treatment can be carried out with use of a high-density plasma generated there.

(3) The sample placed on the support table is situated at a level corresponding to an integer number of times of ¼ wavelength of microwave in the reaction chamber from the microwave inlet. Thus, the adverse effect on the sample by microwaves can be prevented, and the plasma treatment of the sample can be carried out more efficiently.

(4) The magnetic field generating sections arranged to face each other comprise a plurality of magnetic circuits constituted by magnetic field generating coils wound around the magnetic poles arranged to face each other, and a plurality of yokes divided in a direction perpendicular to the axis connecting the coils. Thus, a magnetic field is generated in a direction perpendicular to the sample to be treated in the reaction chamber. In addition, a uniform magnetic field is created in the region where the sample is grounded. Therefore, the efficiency of fine processing and plasma treatment can be increased.

(5) The permanent magnets are arranged near the reaction chamber in the magnetic field generating section. Thus, the power consumption of the magnetic field generating coils can be reduced, and the leak of magnetic field from the permanent magnets to the surroundings of the apparatus can be prevented.

(6) The opening is formed at the center part of each of the mutually facing magnetic field generating sections; therefore, devices such as a microwave introducing section or a sample holding device can easily be assembled in the apparatus, and the size of the apparatus can be reduced.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A plasma generating apparatus comprising:
   microwave introducing means for introducing microwaves;
   plasma generating means for generating a plasma based on microwaves introduced into the microwave introducing means, and storing a sample so that the sample can be freely removed;
   at least a pair of magnetic field generating means each having a magnetic pole, said magnetic field generating means being arranged to face each other with the plasma generating means interposed and generating a magnetic field of a predetermined magnetic flux density consisting of lines of magnetic force which vertically enter a major surface of the sample;
   coupling means for coupling the paired magnetic poles of the magnetic field generating means, and forming a loop of lines of magnetic force; and
   magnetic field generation correcting means for varying the magnetic field of the predetermined magnetic flux density generated by the magnetic field generating means to a magnetic field of a desired magnetic flux density.

2. The apparatus according to claim 1, wherein:
   said pair of magnetic field generating means include at least one pair of highly magnetic members having concave surfaces facing each other, with the plasma generating means arranged therebetween; and
   said coupling means includes a yoke of a highly magnetic body, having a permanent magnet interposed therein, for coupling surfaces of said magnetic members which are opposite the surfaces facing each other.

3. The apparatus according to claim 1, wherein each of the magnetic poles of the magnetic field generating means is formed in a ring shape.

4. The apparatus according to claim 1, wherein said plasma generating means has a cavity resonance structure in which electron cyclotron resonance is caused between a plane having a microwave introducing port of the microwave introducing means and a plane of an electrically conductive support table on which the sample is mounted such that the major surface of the sample is parallel to said plane having the microwave introducing port.

5. The apparatus according to claim 4, wherein the sample mounted on the support table is situated at a level corresponding to an integer number times ¼ of wavelength of microwave from the microwave introducing port in a reaction chamber of the cavity resonance structure.

6. The apparatus according to claim 1, wherein said pair of magnetic field generating means include:
   at least one pair of highly magnetic members having concave surfaces facing each other, with the plasma generating means arranged therebetween; and
   a plurality of permanent magnets provided on sides of said magnetic members which are opposite the surfaces facing each other.

7. The apparatus according to claim 1, wherein said pair of magnetic field generating means have concave surfaces facing each other, with the plasma generating means arranged therebetween.

8. The apparatus according to claim 1, wherein said coupling means includes a highly magnetic yoke having two ends, for coupling said pair of magnetic field generating means to each other in a state where they are located between said two ends.

9. A plasma generating apparatus comprising:
   a rectangular waveguide receiving microwaves generated by a magnetron and having a plurality of microwave supply ports on a microwave output side;
   a glass plate put in contact with the microwave supply ports of the rectangular waveguide;
   a chamber having a surface formed by said glass plate, said chamber being made of an electrically conductive body coupled to the rectangular waveguide via said glass plate;
   exhaust means for maintaining said chamber in a predetermined vacuum state;
   a support table for supporting a sample in said chamber;
   at least a pair of magnetic poles arranged to face each other with said rectangular waveguide and said chamber interposed, and having mutually facing concave surfaces;
   at least a pair of permanent magnets having first surfaces coupled to those surfaces of the magnetic poles, which are opposite to the mutually facing surfaces of the magnetic poles;

a yoke of a highly magnetic body for coupling second surfaces of the permanent magnets; and a pair of controllable solenoid coils provided around the magnetic poles, wherein a magnetic field of a predetermined magnetic flux density consisting of magnetic force lines entering a major surface of the sample vertically is generated, and a plasma generated based on the microwaves introduced into the chamber is supplied vertically to the major surface of the sample, thereby effecting plasma treatment.

10. The apparatus according to claim 9, wherein said waveguide is formed radial so as to guide microwaves from the magnetron in a direction vertical to a plane of the microwave supply ports.

11. The apparatus according to claim 9, wherein each of said magnetic poles has a ring shape, each of the permanent magnets is divided, and the permanent magnets are coupled to those surfaces of the magnetic poles, which are opposite to the mutually facing surfaces of the magnetic poles, and the yoke of high magnetic body couples the divided permanent magnets.

12. The apparatus according to claim 9, wherein the position of maximum intensity of the plasma is set at a level corresponding to ¼ wavelength of microwave above the support table on which the sample is placed.

13. The apparatus according to claim 9, wherein said chamber is formed of a non-magnetic electrically conductive material.

14. The apparatus according to claim 9, wherein said chamber is connected to a heating mechanism.

15. The apparatus according to claim 9, wherein said support table is connected to a temperature control mechanism for heating/cooling the sample placed on the support table.

* * * * *